United States Patent
Lin et al.

(10) Patent No.: US 7,078,972 B2
(45) Date of Patent: Jul. 18, 2006

(54) LINEAR DECIBEL-SCALE VARIABLE GAIN AMPLIFIER

(75) Inventors: Ying-Yao Lin, I-Lan Hsien (TW);
Chao-Cheng Lee, Hsin-Chu (TW);
Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 10/709,197

(22) Filed: Apr. 20, 2004

(65) Prior Publication Data
US 2005/0073362 A1 Apr. 7, 2005

Related U.S. Application Data

(63) Continuation-in-part of application No. 10/708,202, filed on Feb. 16, 2004.

(30) Foreign Application Priority Data
Oct. 1, 2003 (TW) ............................... 92127224 A (51) Int. Cl.
*H03F 3/45* (2006.01)
(52) U.S. Cl. ....................... 330/256; 330/254
(58) Field of Classification Search ............... 330/254, 330/256, 260
See application file for complete search history.

(56) References Cited

U.S. PATENT DOCUMENTS

| | | | |
|---|---|---|---|
| 5,030,924 A * | 7/1991 | Fritz ........................... 330/256 |
| 5,162,678 A | 11/1992 | Yamasaki | |
| 5,247,398 A | 9/1993 | Sidman | |
| 5,572,166 A | 11/1996 | Gilbert | |
| 5,684,431 A | 11/1997 | Gilbert et al. | |
| 5,900,781 A | 5/1999 | Igarashi et al. | |
| 5,912,589 A * | 6/1999 | Khoury et al. ............... 330/261 |
| 6,020,786 A * | 2/2000 | Ashby ......................... 330/256 |
| 6,124,761 A | 9/2000 | Robinson et al. | |
| 6,292,059 B1 * | 9/2001 | Ao et al. ..................... 330/289 |
| 6,509,798 B1 | 1/2003 | Kuroda | |
| 6,525,606 B1 | 2/2003 | Atkinson | |
| 6,724,235 B1 | 4/2004 | Costa et al. | |
| 6,791,413 B1 * | 9/2004 | Komurasaki et al. ........ 330/254 |
| 6,819,183 B1 * | 11/2004 | Zhou et al. .................. 330/289 |
| 6,882,185 B1 | 4/2005 | Walker et al. | |
| 6,894,564 B1 | 5/2005 | Gilbert | |
| 2001/0006353 A1 * | 7/2001 | Setty ........................... 327/563 |
| 2003/0058047 A1 * | 3/2003 | Sakurai ....................... 330/253 |
| 2003/0107438 A1 | 6/2003 | Kimura | |
| 2003/0169090 A1 | 9/2003 | Filoramo et al. | |
| 2005/0068087 A1 | 3/2005 | Kanou | |
| 2005/0184805 A1 * | 8/2005 | Murakami ................... 330/261 |

* cited by examiner

*Primary Examiner*—Linh V. Nguyen
(74) *Attorney, Agent, or Firm*—Winston Hsu (57) ABSTRACT

A linear decibel-scale variable gain amplifier includes an amplifying stage for generating an output voltage according to a differential input voltage, and a gain-controlling stage for outputting a gain-controlling voltage to the amplifying stage according to a first controlling voltage and a second controlling voltage. A voltage gain of the linear decibel-scale variable gain amplifier is inversely proportional to a simple exponential function, and the value of the simple exponential function is determined by the difference between the first controlling voltage and the second controlling voltage. The value of the voltage gain is unaffected by changes of the thermal voltage.

20 Claims, 7 Drawing Sheets

LINEAR DECIBEL-SCALE VARIABLE GAIN AMPLIFIER

CROSS REFERENCE TO RELATED APPLICATIONS

This application is a continuation-in-part of application of U.S. Ser. No. 10/708202 filed on Feb. 16, 2004, which is still pending. This application is related to a co-pending application "LINEAR-IN-DECIBEL VARIABLE GAIN AMPLIFIER" which belongs to the same assignee and filed on the same day with this application.

BACKGROUND OF INVENTION

1. Field of the Invention

The invention relates to a variable gain amplifier, and more particularly, to a variable gain amplifier having a linear decibel-scale gain with respect to the controlling voltage(s).

2. Description of the Prior Art

Wireless communication system development continues to rapidly progress. As a result, many types of high bandwidth high sensitivity transceivers have been proposed. Variable gain amplifiers are often used in these types of transceiver to broaden the processing range of the system. A variable gain amplifier having a linear gain in the decibel (dB) scale with respect to the controlling voltage(s) has the broadest gain range.

Figure 1:
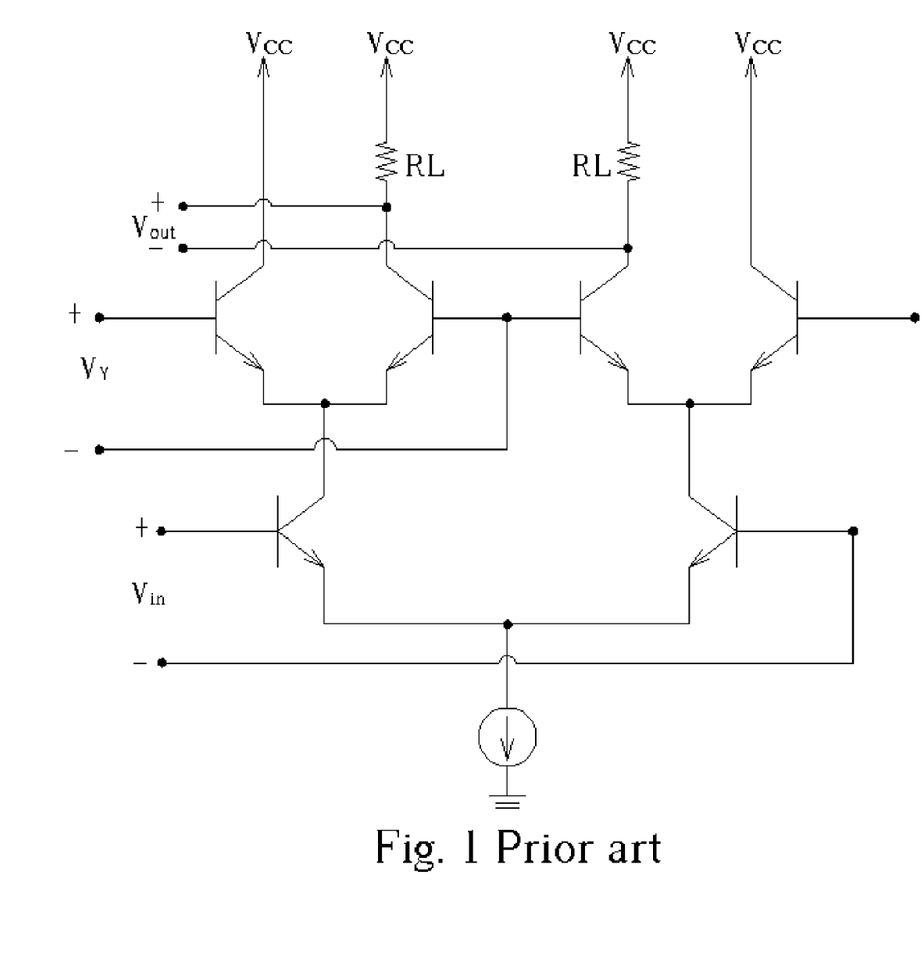
FIG. 1 is a circuit diagram of a conventional variable gain amplifier.

Please refer to FIG. 1, where a circuit diagram of a conventional variable gain amplifier is illustrated. The variable gain amplifier shown in FIG. 1 is a differential amplifier. The voltage gain Av of the variable gain amplifier can be determined from the half circuit of the differential amplifier. Disregarding the phase, the voltage gain Av of this variable gain amplifier is:

$$Av = \frac{Vout}{Vin} = \frac{K}{1 + \exp\left(\frac{Vy}{Vt}\right)} \quad (1)$$

where K is substantially a constant.

From equation 1 it can be seen that the denominator of the voltage gain Av is not a simple exponential function that it has a constant term "1" in addition to the simple exponential function exp(Vy/Vt). Consequently, the voltage gain Av does not have a simple exponential relationship with the controlling voltage Vy.

Figure 2:
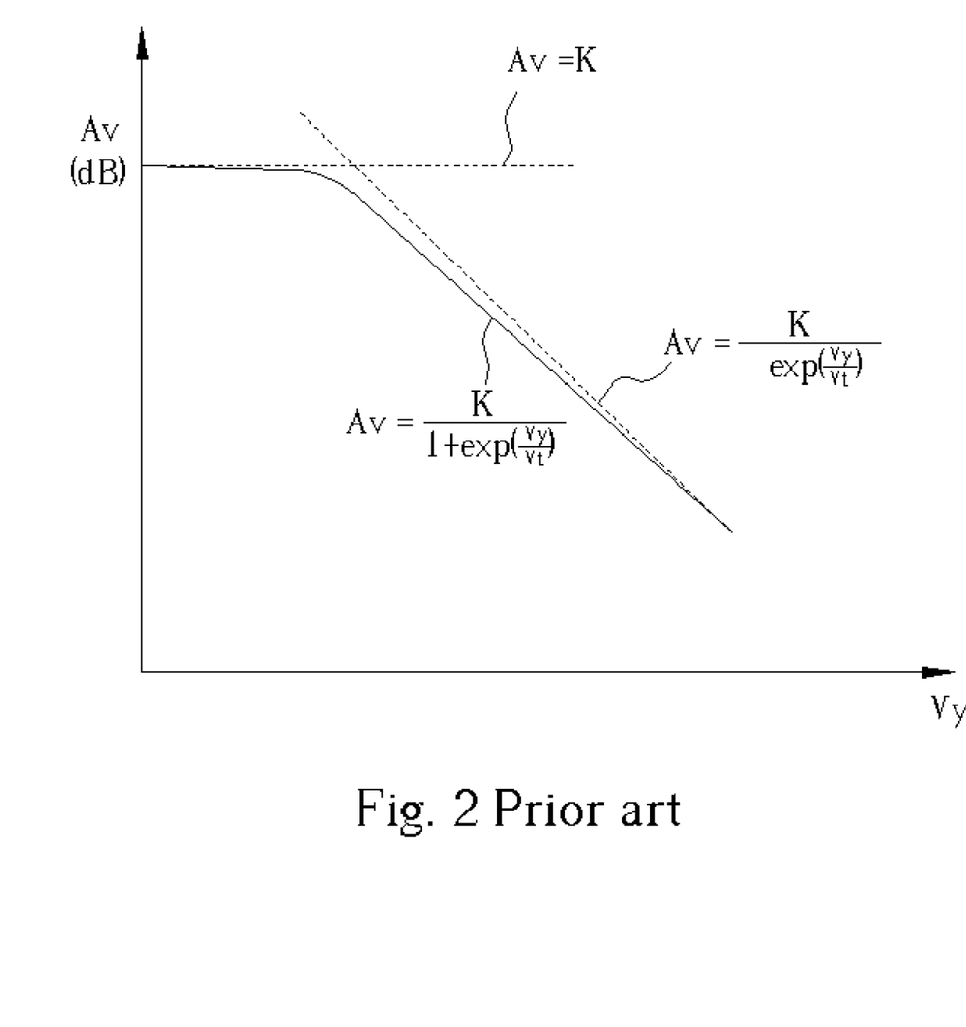
FIG. 2 is a graph showing the relationship between the voltage gain Av and the controlling voltage Vy of FIG. 1.

Please refer to FIG. 2. FIG. 2 is a graph showing the relationship between the voltage gain Av and the controlling voltage Vy of FIG. 1. Note that when Vy<Vt, the voltage gain Av does not change exponentially with respect to the change in the controlling voltage Vy. The smaller the controlling voltage Vy, the less the voltage gain Av changes with respect to the change in the controlling voltage Vy. The area where the voltage gain Av does not have a perfect exponential relationship with the controlling voltage Vy is caused by the constant term 1 in the denominator of equation 1.

Furthermore, equation 1 contains a term called the thermal voltage Vt, which is a variable that changes in response to the change of temperature. The result is that the relationship between the voltage gain Av and the controlling voltage Vy does not remain constant when temperature changes.

SUMMARY OF INVENTION

It is therefore one of the objects of the claimed invention to provide a variable gain amplifier having a linear voltage gain in the decibel-scale with respect to the controlling voltage(s) and which will not be influenced by changes in temperature, to solve the above-mentioned problems.

According to the disclosed embodiment, a variable gain amplifier comprising: an amplifying stage and a gain controlling stage. The amplifying stage is for generating an output voltage according to a differential input voltage. The gain controlling stage is for adjusting a voltage gain of the amplifying stage according to a first controlling voltage and a second controlling voltage. The gain controlling stage comprising a proportional_to_Vt voltage amplifier, a transconductance unit, a first current transforming unit, a second current transforming unit and an output unit. The gain controlling stage can generate a gain controlling voltage to control the voltage gain of the amplifying stage according to the first controlling voltage and the second controlling voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
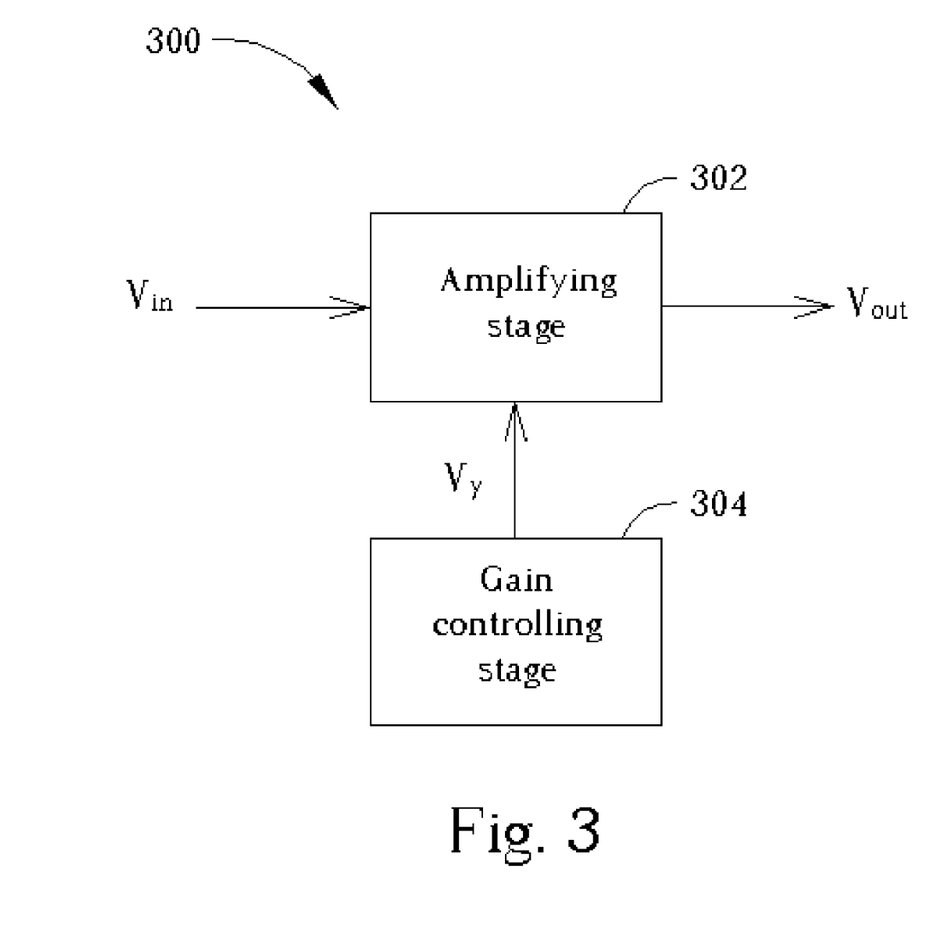
FIG. 3 is a diagram of a variable gain amplifier according to the present invention.

Please refer to FIG. 3 showing a schematic diagram of a variable gain amplifier 300 according to the embodiment of the present invention. The variable gain amplifier 300 comprises an amplifying stage 302 for generating an out-put voltage Vout according to an input voltage Vin and a gain controlling voltage $V_y$. A voltage gain, i.e. the ratio between the output voltage Vout and the input voltage Vin, is determined by the gain controlling voltage $V_y$. A gain controlling stage 304 is for generating the gain controlling voltage Vy.

In this embodiment, the amplifying stage 302 is substantially the same as the variable gain amplifier shown in FIG. 1. Concerning the amplifying stage 302 please refer to FIG. 1 and the above description describing the variable gain amplifier shown in FIG. 1. Referring to equation 1, it can be seen that the value of the voltage gain of the amplifying stage 302 is determined by the gain controlling voltage Vy.

Figure 4:
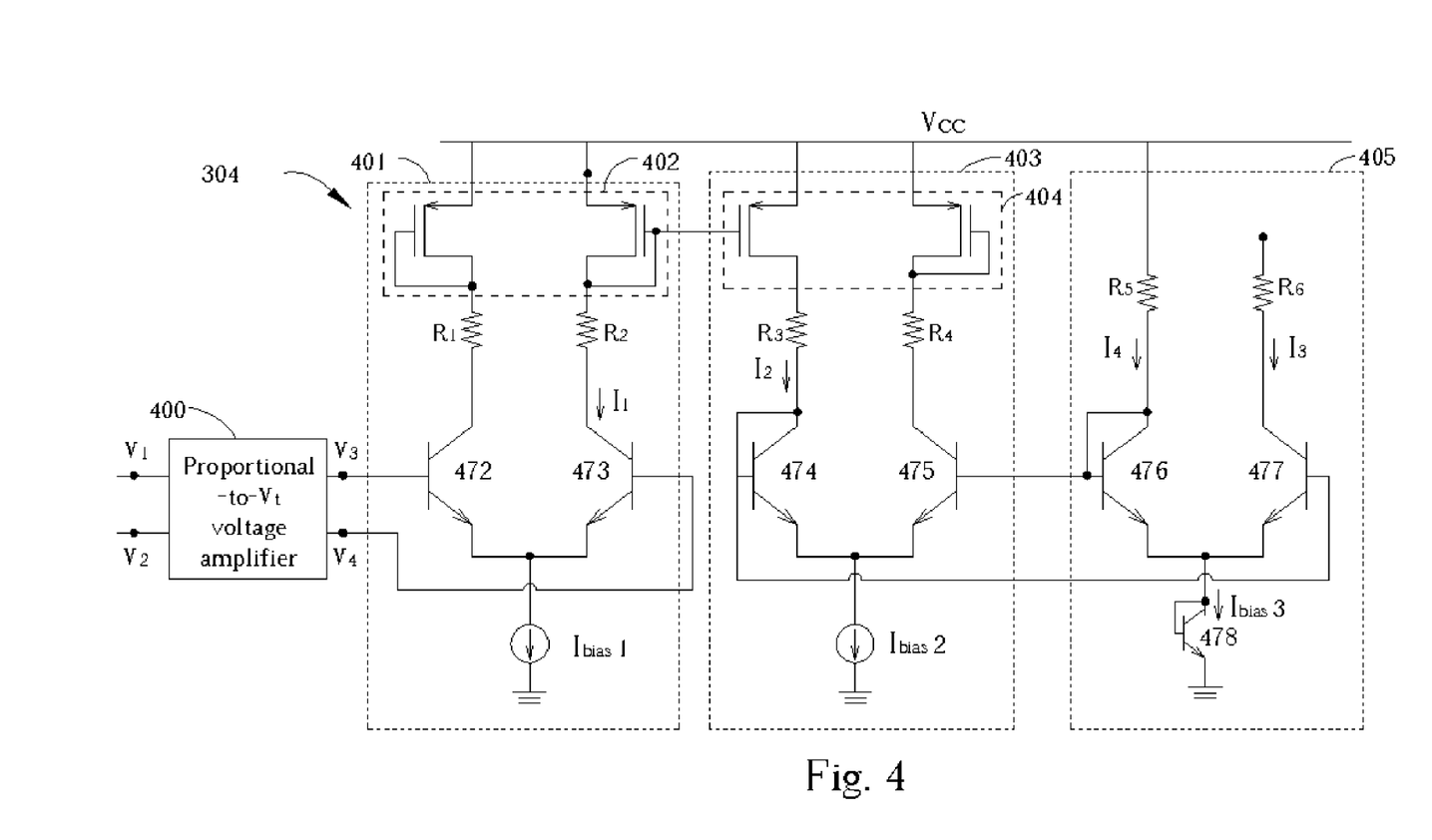
FIG. 4 and FIG. 5 are circuit diagrams of the gain controlling stage of FIG. 3.
Figure 5:
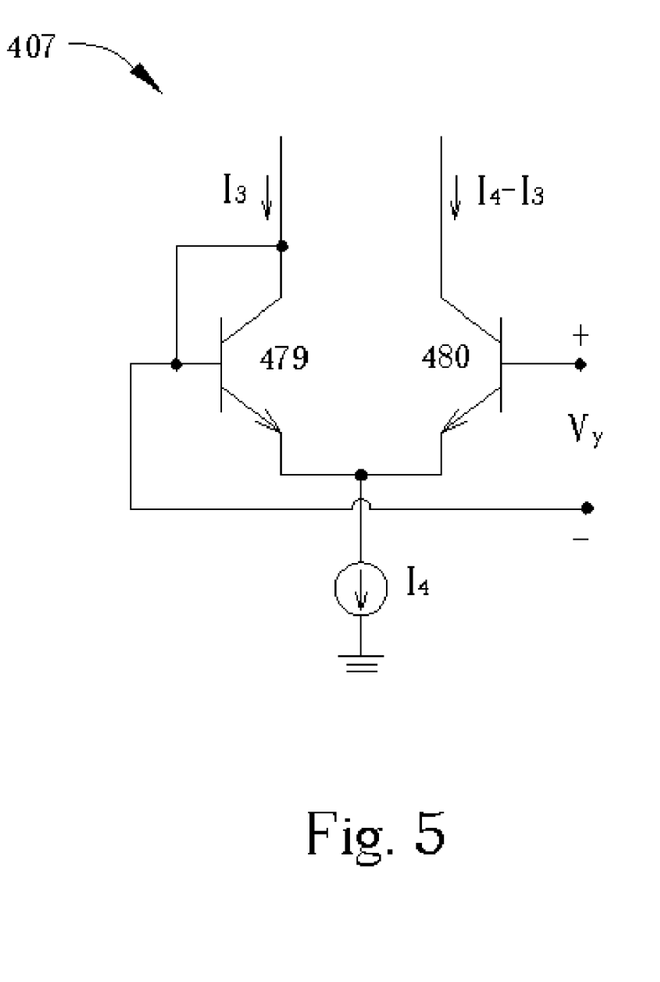

Next, please refer to FIG. 4 and FIG. 5, where circuit diagrams of the gain controlling stage 304 according to the embodiment of the present invention are illustrated. The gain controlling stage 304 is for determining the value of the gain controlling voltage Vy output to the amplifying stage 302 according to a first controlling voltage V1 and a second controlling voltage V2. In this embodiment, the gain controlling stage 304 comprises a proportional_to_Vt voltage amplifier 400, a transconductance unit 401, a first current transforming unit 403, a second current transforming unit 405 (as shown in FIG. 4), and an outputting unit 407 (as shown in FIG. 5).

The proportional_to_Vt voltage amplifier 400 is for generating a third controlling voltage V3 and a fourth controlling voltage V4 according to V1 and V2, wherein the difference (V4−V3) is proportional to the thermal voltage Vt and the difference (V2−V1). The operation of the proportional_to_Vt voltage amplifier 400 will be—explained later in this description.

The transconductance unit 401 comprises a first transistor 472 coupled to the third controlling voltage V3, a second transistor 473 coupled to the fourth controlling voltage V4, a first bias current source Ibias1 coupled to the emitter of the first transistor 472 and the emitter of the second transistor 473 for providing a first bias current Ibias1, a first current source 402, a first resistor R1 coupled between the collector of the first transistor 472 and the first current source 402, and a second resistor R2 coupled between the collector of the second transistor 473 and the first current source 402.

The value of the first current I1 flowing through the collector of the second transistor 473 is determined by the first bias current Ibias1 and the difference between the third controlling voltage V3 and the fourth controlling voltage V4. In this embodiment, the relationship is as follows:

$$I1 = Ibias1 / \left[1 + \exp\left(\frac{V3 - V4}{Vt}\right)\right] \quad (2)$$

Because the transconductance unit 401 is a differential circuit, the collector current of the first transistor 472 is determined by the third controlling voltage V3, the fourth controlling voltage V4, and the first bias current Ibias1. The relationship is similar to that shown in equation 2, only the positions of the terms V3 and V4 are exchanged.

The first current transforming unit 403 is coupled to the transconductance unit 401 through the second current source 404. The first current transforming unit 403 comprises a third transistor 474 having the collector and the base being coupled together, a fourth transistor 475, a second bias current source Ibias2 coupled to the emitter of the third transistor 474 and the emitter of the fourth transistor 475 for providing a second bias current Ibias2, a second current source 404, a third resistor R3 coupled between the collector of the third transistor 474 and the second current source 404, and a fourth resistor R4 coupled between the collector of the fourth transistor 475 and the second current source 404. The second current source 404 and the first current source 402 form a current mirror circuit. Additionally, in this embodiment, the ratio between the collector current I2 of the third transistor 474 and the collector current I1 of the second transistor 473 is the same as the ratio between the first bias current Ibias1 and the second bias current Ibias2, as follows:

$$I2/I1 = Ibias2/Ibias1 \quad (3)$$

Because the first current transforming unit 403 is also a differential circuit, according to the current relationship shown in equation 3, the ratio between the collector current of the fourth transistor 475 and the collector current I2 of the third transistor 474 is the same as the ratio between the collector current of the first transistor 472 and the collector current I1 of the second transistor 473. In this embodiment, when the first bias current Ibias1 equals the second bias current Ibias2, the collector current of the first transistor 472 will also be equal to the collector current of the fourth transistor 475, and the collector current I1 of the second transistor will be equal the collector current I2 of the third transistor.

The second current transforming unit 405 comprises a fifth transistor 476 having the base and the collector coupled to the base of the fourth transistor 475, a sixth transistor 477 having the base coupled to the base and the collector of the third transistor 474, and a seventh transistor 478 coupled to the emitter of the fifth transistor 476 and the emitter of the sixth transistor 477 for providing a third bias current Ibias3. Due to the loop formed between the third transistor 474, the fourth transistor 475, the fifth transistor 476, and the sixth transistor 477, the ratio between the collector current I3 of the sixth transistor 476 and the collector current I2 of the third transistor 474 is the same as the ratio between the third Ibias2 and the first bias current Ibias1. This is shown in the following equation:

$$I3/I2 = Ibias3/Ibias2 \quad (4)$$

The second current transforming unit 405 is also a differential circuit. Similar to the relationship shown in equation 4, the ratio between the collector current I4 of the fifth transistor 476 and the collector current I3 of the sixth transistor 477 is the same as the ratio between the collector current of the fourth transistor 475 and the collector current I2 of the third transistor 474.

Hence, according to equations 2, 3, 4, and the relationship between I4 and I3 described above, the circuit shown in FIG. 4 is a voltage controlled current amplifier. By way of changing the value of the differential input voltage, i.e. the difference between the third controlling voltage V3 and the fourth controlling voltage V4, the ratio between the output currents I3 and I4 is controlled. The ratio is as follows:

$$\frac{I4}{I3} = K \cdot \exp\left(\frac{V3 - V4}{Vt}\right) \quad (5)$$

The outputting unit 407 shown in FIG. 5 comprises a eighth transistor 479 having the base and the collector being coupled together, a ninth transistor 480, and a fourth bias current source I4 coupled to the emitter of the eighth transistor 479 and the emitter of the ninth transistor 480. Please note that the voltage controlled current amplifier shown in FIG. 4 is coupled to the outputting unit 407 shown in FIG. 5 through at least one current mirror device (not shown), such that the bias current output by the fourth bias current source is substantially the same as the collector current I4 of the fifth transistor 476, and the collector current I3 of the sixth transistor 477 is substantially the same as the collector current I3 of the eighth transistor 479. Although the current mirrors are not shown, a person skilled in the art can easily design such the at least one current mirror device. At this point, the collector current of the eighth transistor 479 will be equal to the collector current I3 of the sixth transistor 477, and the collector current of the ninth transistor 480 will be equal to the difference between the collector current I4 of the fifth transistor 476 and the collector current I3 of the sixth transistor 477. The base of the eighth transistor 479 and the base of the ninth transistor 480 are for coupling to the amplifying stage 302 and outputting the gain controlling voltage Vy. Hence, the relationship of the gain controlling voltage Vy, the collector current I3 of the eighth transistor 479 and the collector current (I4−I3) of the ninth transistor 480 is follows:

$$Vy = Vt \cdot \ln\left(\frac{I4 - I3}{I3}\right) = Vt \cdot \ln\left(\frac{I4}{I3} - 1\right) \qquad (6)$$

Accordingly, disregarding the proportional_to_Vt voltage amplifier 400, the gain controlling stage 304 is for determining the current relation in each stage of the differential circuit according to the difference between the third controlling voltage V3 and the fourth controlling voltage V4, and for determining the value of the gain controlling voltage Vy according to these current relationships. Consequently, the relationship between the gain controlling voltage Vy, the third controlling voltage V3, and the fourth controlling voltage V4 is as follows:

$$Vy = Vt \cdot \ln\left[K \cdot \exp\left(\frac{V3 - V4}{Vt}\right) - 1\right] \qquad (7)$$

Using the gain controlling voltage Vy output by the gain controlling stage 304 as the controlling voltage Vy of the amplifying stage 302 shown in FIG. 1, the voltage gain of the amplifying stage 302, i.e. the ratio between the output voltage Vout and the input voltage Vin is as follows:

$$Av = \frac{Vout}{Vin} = \frac{K1}{\exp[K2(V3 - V4)]} \qquad (8)$$

where K1 relates to the output resistance RL of the amplifying stage 302, and K2 relates to the thermal voltage Vt of bipolar junction transistors, i.e. K2 is proportional to 1/Vt. In this embodiment K1 is a constant, however, the value of K2 can be influenced by thermal voltage Vt. In other words, any factor influencing the thermal voltage can change the value of K2.

Figure 7:
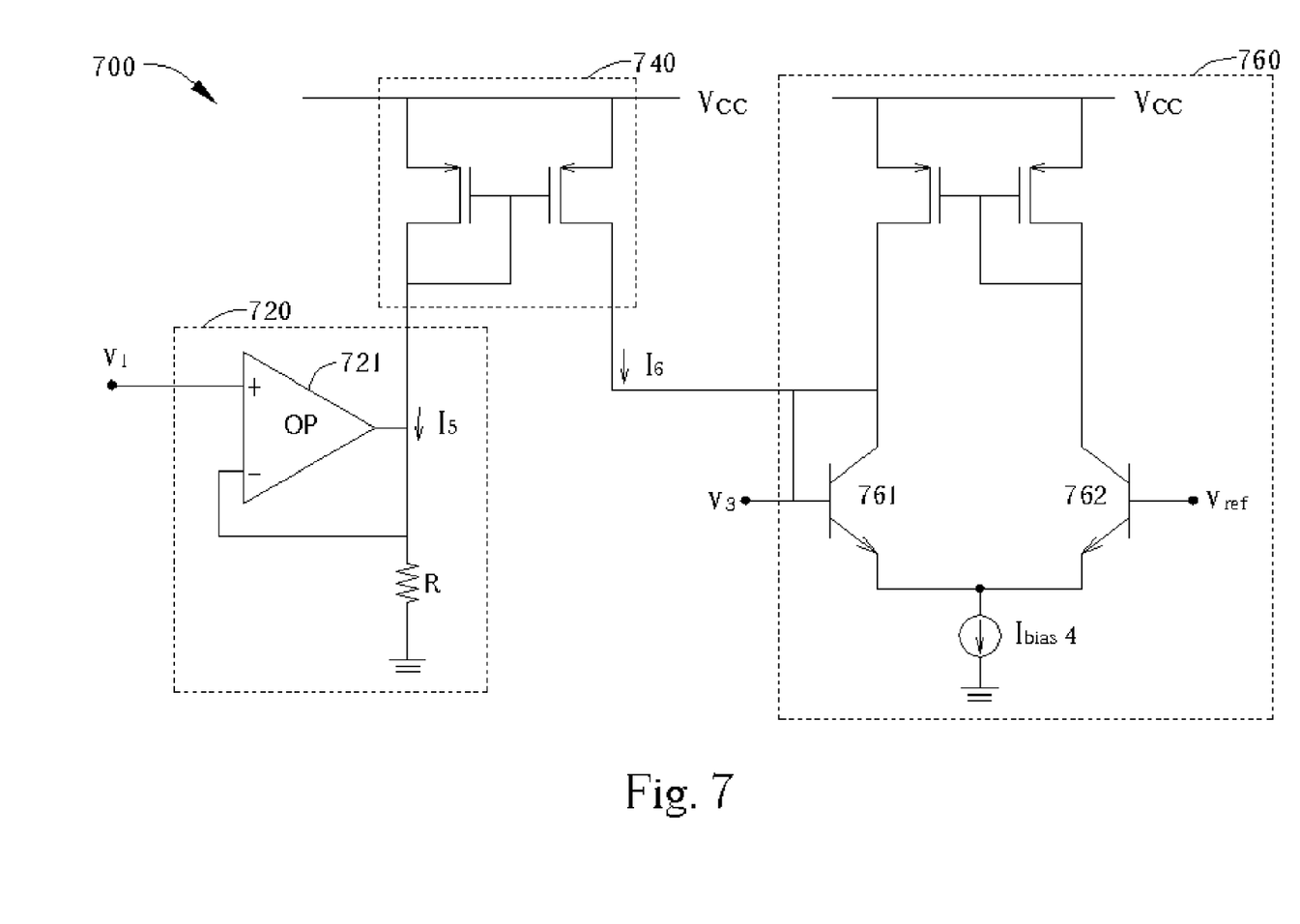
FIG. 7 is a diagram of a proportional_to_Vt voltage amplifier according to the present invention.

Please refer to FIG. 7 where an embodiment of the proportional_to_Vt voltage amplifier according to the embodiment of the present invention is illustrated. In FIG. 7 the proportional_to_Vt voltage amplifier 700 has a single input end (V1) and a single output end (V3), however, it is also possible to use two amplifiers as shown in FIG. 7 to form a differential type proportional_to_Vt voltage amplifier.

The proportional_to_Vt voltage amplifier 700 contains a transconductance unit 720, a current mirror 740, and a transresistance unit 760. The transconductance unit 720 contains an operational amplifier 721 and a resistor R, for generating a fifth current I5 according to the first controlling voltage V1, wherein I5=V1/R. The current mirror 740 is for generating a sixth current I6 by replicating the fifth current I5. The transresistance unit 760 couples to the current mirror 740 and a reference voltage Vref, comprising a tenth transistor 761, an eleventh transistor 762, and a fourth current source Ibias4. Through the circuit configuration shown in FIG. 7, the relationship between the third controlling voltage V3 and the first controlling voltage V1 is as follows:

$$V3 - Vref = \frac{V1}{R \cdot Gm} \qquad (9)$$

where Gm is the transconductance of the transistors 761 and 762. Because Gm=Ic/Vt (in this embodiment Ic is substantially equal to Ibias4/2), V1−Vref will be proportional to the thermal voltage Vt. Combining two proportional_to_Vt voltage amplifiers 700 shown in FIG. 7 can form a differential proportional_to_Vt voltage amplifier 400 shown in FIG. 4, having the relationship between its inputs and outputs be as follows:

$$V4 - V3 = K3 \cdot Vt \cdot (V1 - V2) \qquad (10)$$

With the proportional_to_Vt voltage amplifier 400 combined in the gain controlling stage 304, the voltage gain Av of the variable gain amplifier 300 will be as follows:

$$Av = \frac{Vout}{Vin} = \frac{K1}{\exp[K4(V1 - V2)]} \qquad (11)$$

where both K1 and K4 are constants. The result is that the voltage gain Av of the variable gain amplifier 300 has a simple exponential relation with the first controlling voltage V1 and the second controlling voltage V2, and the voltage gain Av will not be affected by the thermal voltage.

Please note that the above-mentioned gain controlling stage 304 is just one possible embodiment, the scope of the present invention is not limited by the gain controlling stage. Any circuit that generates the gain controlling voltage Vy being proportional to ln(Ia/Ib−K3) can be used in the present invention. Wherein K3 is a constant, Ia corresponds to the first controlling voltage V1, and Ib corresponds to the second controlling voltage V2.

Figure 6:
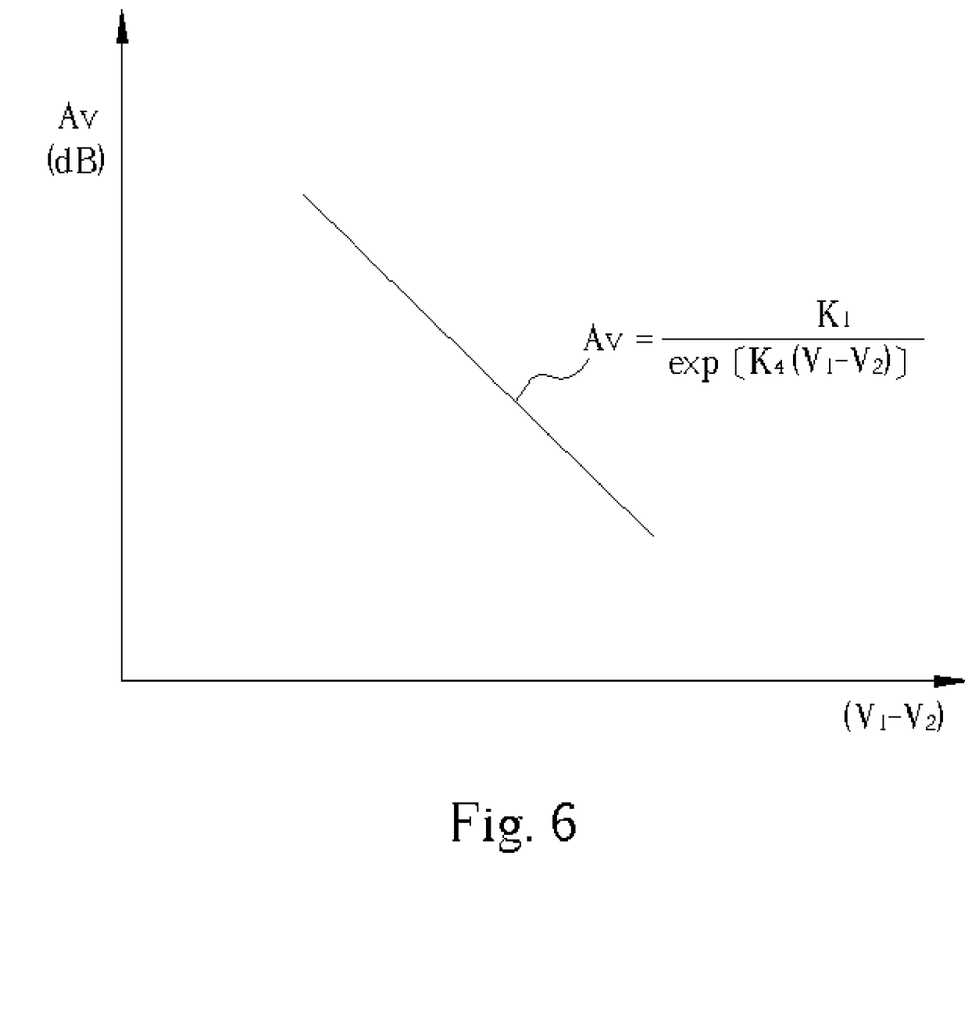
FIG. 6 is a graph showing the relationship between the voltage gain Av and the difference between the first and the second controlling voltages according to equation 11.

Please refer to equation 11, through the gain controlling stage 304, the relationship between the voltage gain Av of the amplifying stage 302, and the difference between V1 and V2, the gain is a simple exponential function, as shown in FIG. 6. Because there is no Vt term in equation 11, the voltage gain Av is not affected by the thermal voltage. That is the value of the voltage gain Av is independent of the thermal voltage. Additionally, in the above-mentioned embodiment, the amplifying stage has two input ends for receiving differential input voltage but only a single output end, however, the amplifying stage according to the present invention can also have two output ends for generating a differential output voltage.

In addition, the amplifying stage used with the present invention does not necessarily need to be as shown in FIG. 1. Any circuit that has a voltage gain with a denominator containing a constant term and a simple exponential function can be used with the present invention.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A proportional_to_Vt voltage amplifier, comprising:
   a transconductance unit for generating a first current according to a first input voltage; and
   a transresistance unit, coupled to a reference voltage, for generating a first output voltage according to the first current, wherein the difference between the first output voltage and the reference voltage is proportional to a thermal voltage;
wherein the transresistance unit comprises:
a first transistor for receiving the reference voltage;
a second transistor for generating the first output voltage;
a second current mirror coupled to the first transistor and the second transistor; and
a first bias current source coupled to the first transistor and the second transistor for providing a first bias current.

2. The proportional_to_Vt voltage amplifier of claim 1, wherein the transconductance unit comprises:
an operational amplifier having a first input end, a second input end, and an output end, wherein the first input end couples to the first input voltage; and
a first resistor having one end being coupled to the second input end and the output end of the operational amplifier, and the other end being coupled to ground;
wherein the first current flows through the first resistor.

3. The proportional_to_Vt voltage amplifier of claim 1 further comprising:
a first current mirror, coupled to the transconductance unit, for generating a second current according to the first current.

4. The proportional_to_Vt voltage amplifier of claim 1, wherein the second current mirror comprises:
a third transistor having a first and a second ends coupled to the first transistor; and
a fourth transistor having a first end coupled to the second transistor and a second end coupled to the gate of the third transistor.

5. The proportional_to_Vt voltage amplifier of claim 1, wherein the proportional_to_Vt voltage amplifier is a half circuit of a differential proportional_to_Vt amplifier.

6. A proportional_to_Vt voltage amplifier, comprising:
a transconductance unit for generating a first current according to a first input voltage; and
a transresistance unit, coupled to a reference voltage, for generating a first output voltage according to the first current, wherein the difference between the first output voltage and the reference voltage is proportional to a thermal voltage;
a first resistor having one end being coupled to the second input end and the output end of the operational amplifier, and the other end being coupled to ground;
wherein the proportional to Vt voltage amplifier further comprises a first current mirror coupled between the transconductance unit and the transresistance unit for generating a second current according to the first current, and the transresistance unit comprises a second current mirror coupled to the transconductance unit through the first current mirror.

7. The proportional_to_Vt voltage amplifier of claim 6,
a first current mirror, coupled to the operational amplifier unit, for generating a second current according to the first current
wherein the transconductance unit comprises;
an operational amplifier having a first input end, a second input end, and an output end, wherein the first input end couples to the first input voltage; and
wherein the first current flows through the first resistor.

8. The proportional_to_Vt voltage amplifier of claim 6, wherein the transresistance unit comprises:

a first transistor for receiving the reference voltage;
a second transistor having a first end coupled to the first current mirror, wherein the second transistor is for generating the first output voltage;
the second current mirror coupled to the first transistor and the second transistor; and
a first bias current source coupled to the first transistor and the second transistor for providing a first bias current.

9. The proportional_to_Vt voltage amplifier of claim 8, wherein the second current mirror comprises:
a third transistor having a first and a second ends coupled to the first transistor; and
a fourth transistor having a first end coupled to the second transistor and a second end coupled to the gate of the third transistor.

10. The proportional_to_Vt voltage amplifier of claim 6, wherein the proportional_to_Vt voltage amplifier is a half circuit of a differential proportional_to_Vt amplifier.

11. A proportional_to_Vt voltage amplifier, comprising:
a transconductance unit for generating a first current according to a first input voltage;
a transresistance unit, coupled to a reference voltage, for generating a first output voltage according to the first current, wherein the difference between the first output voltage and the reference voltage is proportional to a thermal voltage; and
a first current mirror, coupled to the transconductance unit, for generating a second current according to the first current;
wherein the transresistance unit further comprises:
a first transistor for receiving the reference voltage;
a second transistor having a first end coupled to the first current mirror, wherein the second transistor is for generating the first output voltage;
a second current mirror coupled to the first transistor and the second transistor; and
a first bias current source coupled to the first transistor and the second transistor for providing a first bias current.

12. The proportional_to_Vt voltage amplifier of claim 11, wherein the transconductance unit comprises:
an operational amplifier having a first input end, a second input end, and an output end, wherein the first input end couples to the first input voltage; and
a first resistor having one end being coupled to the second input end and the output end of the operational amplifier, and the other end being coupled to ground;
wherein the first current flows through the first resistor.

13. The proportional_to_Vt voltage amplifier of claim 11, wherein the second current mirror comprises:
a third transistor having a first and second ends coupled to the first transistor; and
a fourth transistor having a first end coupled to the second transistor and a second end coupled to the gate of the third transistor.

14. The proportional_to_Vt voltage amplifier of claim 11, wherein the proportional_to_Vt voltage amplifier is a half circuit of a differential proportional_to_Vt amplifier.

15. A variable gain amplifier, comprising:
a proportional_to_Vt voltage amplifier, comprising:
a transconductance unit for generating a first current according to a first input voltage; and
a transresistance unit, coupled to a reference voltage, for generating a first output voltage according to the first current, wherein the difference between the first output voltage and the reference voltage is proportional to a thermal voltage;

a gain controlling stage for generating a gain controlling voltage to control a voltage gain of the variable gain amplifier according to the first output voltage; and an amplifying stage for providing the voltage gain of the variable gain amplifier according to the gain controlling voltage;

wherein the voltage gain is independent of the thermal voltage.

16. The variable gain amplifier of claim 15, wherein the voltage gain changes linearly in decibel in response to the gain controlling voltage.

17. The variable gain amplifier of claim 15, wherein the transconductance unit comprises:

an operational amplifier having a first input end, a second input end, and an output end, wherein the first input end couples to the first input voltage; and a first resistor having one end being coupled to the second input end and the output end of the operational amplifier, and the other end being coupled to ground;

wherein the first current flows through the first resistor.

18. The variable gain amplifier of claim 15 further comprising a first current minor coupled between the transconductance unit and the transresistance unit.

19. The variable gain amplifier of claim 15, wherein the transresistance unit comprises:

a first transistor for receiving the reference voltage;

a second transistor for generating the first output voltage;

a second current mirror coupled to the first transistor and the second transistor; and a first bias current source coupled to the first transistor and the second transistor for providing a first bias current.

20. The variable gain amplifier of claim 15, wherein the amplifying stage couples to the gain controlling stage by using a current mirror structure.

* * * * *